(12) United States Patent
Joo et al.

(10) Patent No.: US 8,294,200 B2
(45) Date of Patent: Oct. 23, 2012

(54) NON-VOLATILE MEMORY DEVICE

(75) Inventors: Moon Sig Joo, Icheon-si (KR); Seung Ho Pyi, Icheon-si (KR); Yong Soo Kim, Suwon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/089,865

(22) Filed: Apr. 19, 2011

(65) Prior Publication Data

US 2011/0193154 A1    Aug. 11, 2011

Related U.S. Application Data

(62) Division of application No. 11/770,985, filed on Jun. 29, 2007, now Pat. No. 7,948,025.

(30) Foreign Application Priority Data

Dec. 29, 2006  (KR) .................. 10-2006-0138825

(51) Int. Cl.
*H01L 29/792* (2006.01)
(52) U.S. Cl. ............. 257/324; 257/314; 257/E29.309
(58) Field of Classification Search .......... 257/314–316, 257/324, E29.309
See application file for complete search history.

(56) References Cited

U.S. PATENT DOCUMENTS

| | | | |
|---|---|---|---|
| 6,709,928 B1 * | 3/2004 | Jenne et al. | 438/264 |
| 6,998,317 B2 | 2/2006 | Ono | |
| 7,005,355 B2 | 2/2006 | Kleint et al. | |
| 2004/0053468 A1 | 3/2004 | Dong et al. | |
| 2005/0006696 A1 | 1/2005 | Noguchi et al. | |
| 2006/0091458 A1 | 5/2006 | Kim et al. | |
| 2006/0192246 A1 | 8/2006 | Jeon et al. | |
| 2006/0261401 A1 | 11/2006 | Bhattacharyya | |
| 2006/0284236 A1 | 12/2006 | Bhattacharyya | |
| 2008/0093661 A1 | 4/2008 | Joo et al. | |

FOREIGN PATENT DOCUMENTS

| | | |
|---|---|---|
| KR | 1020030064490 | 8/2003 |
| KR | 10-2005-0060848 | 6/2005 |
| KR | 10-2006-0018532 | 3/2006 |
| KR | 10-2006-0068462 | 6/2006 |
| KR | 10-0811272 | 2/2008 |

* cited by examiner

*Primary Examiner* — Allison P Bernstein
(74) *Attorney, Agent, or Firm* — Marshall, Gerstein & Borun LLP

(57) ABSTRACT

A non-volatile memory device includes a substrate, a tunneling layer over the substrate, a charge trapping layer including a nitride layer and a silicon boron nitride layer over the tunneling layer, and a blocking layer over the charge trapping layer, and a control gate electrode arranged on the blocking layer.

4 Claims, 3 Drawing Sheets

NON-VOLATILE MEMORY DEVICE

CROSS-REFERENCE TO RELATED APPLICATIONS

This is a division of U.S. application Ser. No. 11/770,985 filed Jun. 29, 2007, which claims the priority benefit under USC 119 of KR 10-2006-138825, filed on Dec. 29, 2006, the entire respective disclosures of which are incorporated herein by reference.

BACKGROUND OF THE INVENTION

The invention relates to a non-volatile memory device and, more particularly, to a non-volatile memory device having a charge trapping layer with improved erase characteristics and a method for fabricating the non-volatile memory device.

Semiconductor memory devices generally used for storing data are categorized as volatile or non-volatile memory devices. When the power supply is terminated, volatile memory devices lose stored data, but non-volatile memory devices maintain stored data. Accordingly, non-volatile memory devices are widely utilized in such devices as cellular phones, memory cards for storing music and/or image data, and other devices which are placed under adverse power conditions, e.g., discontinuous power supply, intermittent power breaks, or a need for low power consumption.

The cell transistor of such a non-volatile memory device has a stacked floating gate structure. The stacked floating gate structure includes a gate insulating layer, a floating gate electrode, an inter-gate insulating layer, and a control gate electrode sequentially stacked on a channel region of a cell transistor. However, the stacked floating gate structure has a limitation in improving an integration level of a memory device due to interference caused by the improvement in an integration level. Accordingly, there has been increased interest for a non-volatile memory device having a charge trapping layer.

A non-volatile memory device having a charge trapping layer includes a substrate having a channel region therein, a tunneling layer, a charge trapping layer, a blocking layer, and a control gate electrode stacked in this order. Such a structure is also called a "silicon-oxide-nitride-oxide-silicon (SONOS) structure" or a "metal-oxide-nitride-oxide-silicon (MONOS) structure."

FIG. 1 is a cross-sectional view illustrating a non-volatile memory device having a general charge trapping layer. Referring to FIG. 1, a tunneling insulating layer 110 as a tunneling layer is arranged on a semiconductor substrate 100, e.g., a silicon substrate. A pair of impurity regions 102 (e.g., source/drain regions) are arranged in the semiconductor substrate 100. The impurity regions 102 are spaced apart from each other. A channel region 104 is arranged between the impurity regions 102. The tunneling insulating layer 110 is arranged on the channel region 104. A silicon nitride layer 120 as a charge trapping layer is arranged on the tunneling insulating layer 110. A blocking insulating layer 130 as a blocking layer is arranged on the silicon nitride layer 120. A control gate electrode 140 is arranged on the blocking insulating layer 130.

A process for operating the non-volatile memory device having such a structure is described in detail below. First, the control gate electrode 140 is positively charged and a predetermined bias voltage is applied to the impurity region 102. As a result, hot electrons are trapped from the substrate 100 into a trap site of the silicon nitride layer 120 as a charge trapping layer. Such a phenomenon is an operation for writing information in each memory cell or an operation for programming the memory cell. Similarly, the control gate electrode 140 is negatively charged and a predetermined bias voltage is applied to the impurity region 102. As a result, holes are trapped from the substrate 100 into the trap site of the silicon nitride layer 120 as a charge trapping layer. Then, the trapped holes are recombined with electrons present in the trap site. This phenomenon is an operation for erasing the programmed memory cell.

The non-volatile memory device having a general charge trapping layer has a disadvantage of low erase speed. More specifically, upon programming of the non-volatile memory device having this structure, electrons are trapped into a deep trap side, which is relatively far from the conduction band of the silicon nitride layer 120. For this reason, a relatively high voltage is needed to erase the device. In the case where a high voltage is applied to the control gate electrode 140 for erasing, there occurs backward tunneling in which electrons present in the control gate electrode 140 pass through the blocking insulating layer 130. For this reason, cells are undesirably programmed, and thus an error, e.g., an increase in threshold voltage occurs.

In order to prevent backward tunneling of electrons into the control gate electrode 140, it has been suggested to use in a non-volatile memory device a structure that uses high dielectric (high-k) materials such as aluminum oxide ($Al_2O_3$) for the blocking insulating layer 130, and to use sufficiently large work function metallic gates for the control gate electrode 140. Such a structure is also called a "metal-alumina-nitride-oxide-silicon (MANOS) structure." This structure prevents backward tunneling, but fails to secure a desired erase speed due to the low trap density of the charge trapping layer, and it has a limitation in realizing a sufficiently low threshold voltage even after the erasing operation.

BRIEF SUMMARY OF THE INVENTION

In one embodiment, the invention provides a non-volatile memory device including: a substrate; a tunneling layer over the substrate; a charge trapping layer including a nitride layer and a silicon boron nitride layer over the tunneling layer; a blocking layer over the charge trapping layer; and a control gate electrode arranged on the blocking layer.

In another embodiment, the inventions provides a non-volatile memory device including: a substrate; a tunneling layer over the substrate; a charge trapping layer including a first nitride layer, a silicon boron nitride layer and a second nitride layer over the tunneling layer; a blocking layer over the charge trapping layer; and a control gate electrode arranged on the blocking layer.

In another embodiment, the invention provides a method for fabricating a non-volatile memory device including the steps of: forming a tunneling layer over a substrate; forming a nitride layer over the tunneling layer; forming a silicon boron nitride layer over the nitride layer; forming a blocking layer over the silicon boron nitride layer; and forming a control gate electrode over the blocking layer.

In yet another embodiment, the invention provides a method for fabricating a non-volatile memory device including the steps of: forming a tunneling layer over a substrate; forming a first nitride layer over the tunneling layer; forming a silicon boron nitride layer over the first nitride layer; forming a second nitride layer over the silicon boron nitride layer; forming a blocking layer over the second boron nitride layer; and forming a control gate electrode over the blocking layer.

DETAILED DESCRIPTION OF THE INVENTION

The invention is explained in greater detail below with reference to the following examples and the accompanying drawings. However, these examples are given for the purpose of illustration and are not intended to limit the scope of the invention.

Figure 1:
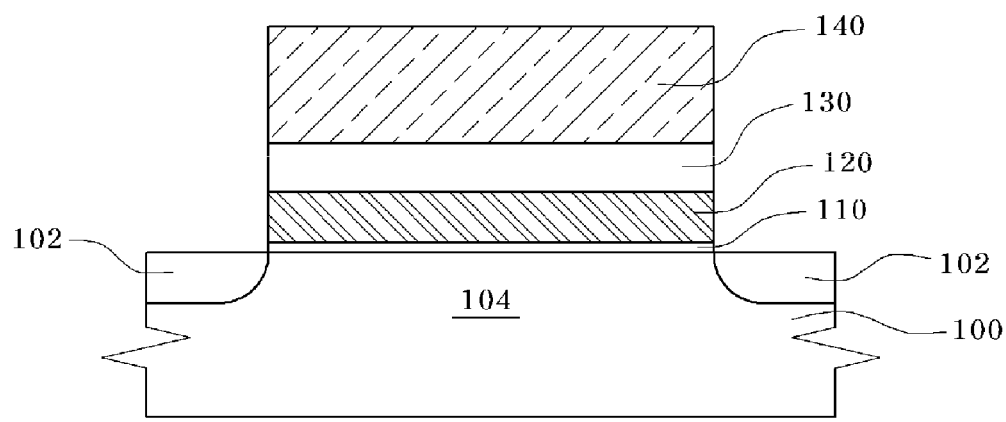
FIG. 1 is a cross-sectional view illustrating a non-volatile memory device having a general charge trapping layer.
Figure 2:
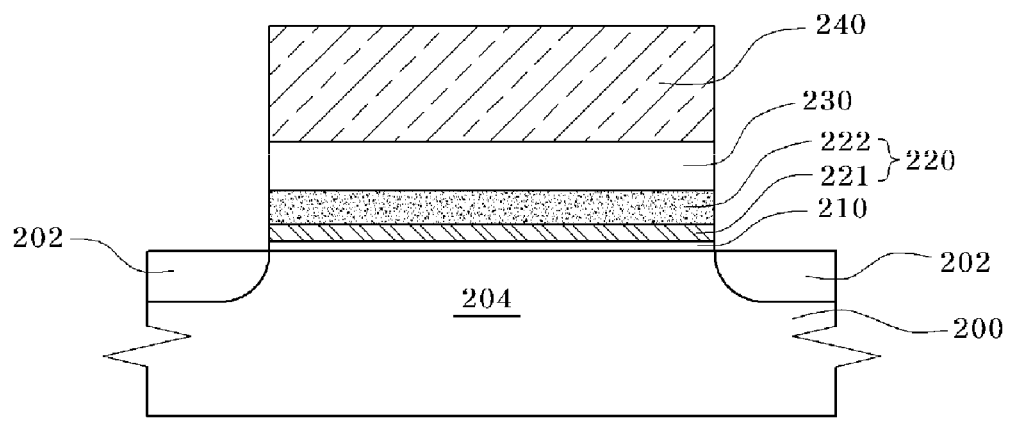
FIG. 2 is a cross-sectional view illustrating a non-volatile memory device having a charge trapping layer according to one embodiment of the invention.

FIG. 2 is a cross-sectional view illustrating a non-volatile memory device having a charge trapping layer according to one embodiment of the invention. Referring to FIG. 2, the non-volatile memory device includes a tunneling layer 210, a charge trapping layer 220, a blocking layer 230, and a control gate electrode 240 sequentially arranged on a substrate 200. The charge trapping layer 220 comprises or consists of a nitride layer 221 and a silicon-boron-nitride (SiBN) layer 222 stacked in this order. The substrate 200 includes a pair of impurity regions 202 spaced apart from each other by a channel region 204. The substrate 200 may be a silicon substrate or silicon on insulator (SOI). The impurity regions 202 are general source/drain regions.

The tunneling layer 210 is an insulating layer. Under predetermined conditions, charge carriers such as electrons or holes can be injected through the tunneling layer 210 into the charge trapping layer 220. The tunneling layer 210 is preferably formed of silicon oxide ($SiO_2$). The thickness of the tunneling layer 210 is preferably about 20 Å to 60 Å. When the tunneling layer 210 has an excessively small thickness, it deteriorates due to the repeated tunneling of charge carriers, thus causing a deterioration in the stability of a memory device. On the other hand, when the tunneling layer 210 has an excessively large thickness, the tunneling of charge carriers cannot be favorably performed.

The charge trapping layer 220 functions to trap electrons or holes introduced through the tunneling layer 210. The charge trapping layer 220 is a double-layer comprising or consisting of the nitride layer 221 and the silicon-boron-nitride (SiBN) layer 222, which layers are sequentially deposited. The nitride layer 221 prevents the diffusion of boron (B) from the silicon-boron-nitride (SiBN) layer 222 to the tunneling layer 210. In addition, the nitride layer 221 offsets the deterioration of retention characteristics, which is caused by the conductivity of the high-trap density silicon-boron-nitride (SiBN) layer 222. To perform these functions, the nitride layer 221 is preferably a stoichiometric silicon nitride ($Si_3N_4$) layer, or a silicon oxide nitride (SiON) layer. The silicon oxide nitride (SiON) layer exhibits superior trapping capability, and thus provides improved retention characteristics, when compared to the stoichiometric silicon nitiride ($Si_3N_4$) layer.

The charge trapping layer 220 preferably has a thickness of about 60 Å to 180 Å. The nitride layer 221 preferably has a thickness of about 20 Å to 60 Å. The silicon boron nitride layer 222 preferably has a thickness of about 40 Å to 120 Å. Boron (B) contained in the silicon boron nitride layer 222 acts as an impurity therein. As a result, the silicon boron nitride layer 222 has a high trap density, as compared to general nitride layers (e.g., a silicon nitride layer). The higher the concentration of boron (B), the higher the trap density. However, in the case where the concentration of boron (B) contained in the silicon boron nitride layer 222 is excessively high, the overall reliability of the silicon boron nitride layer 222 is degraded. Accordingly, the concentration of the boron (B) in the silicon boron nitride layer 222 is preferably adjusted to about 1 wt. % to 30 wt. %.

The blocking layer 230 is an insulating layer for blocking the migration of charges between the charge trapping layer 220 and the control gate electrode 240. The blocking layer 230 includes a silicon oxide ($SiO_2$) layer preferably deposited by chemical vapor deposition (CVD), or an aluminum oxide ($Al_2O_3$) layer. Alternatively, the blocking layer 230 includes a high-dielectric insulating layer, e.g., a hafnium oxide ($HfO_2$) layer, a hafnium aluminum oxide (HfAlO) layer, a zirconium oxide ($ZrO_2$) layer, or a combination thereof. When an aluminum oxide ($Al_2O_3$) layer is used as the blocking layer 230, the aluminum oxide ($Al_2O_3$) layer preferably has a thickness of 50 Å to 300 Å.

The control gate electrode 240 allows electrons or holes to be trapped from the channel region 204 in the substrate 200 into a trap site in the charge trapping layer 220 when a predetermined voltage is applied to the control gate electrode 240. The control gate electrode 240 is preferably a polysilicon layer or a metallic layer. When the control gate electrode 240 is a polysilicon layer, it preferably has a silicon-oxide-nitride-oxide-silicon (SONOS) structure. On the other hand when the control gate electrode 240 is a metallic layer, it preferably has a metal-oxide-nitride-oxide-silicon (MONOS) structure. Furthermore, in the case where the control gate electrode 240 and the blocking layer 230 are a metallic layer and an aluminum oxide ($Al_2O_3$) layer, respectively, they preferably have a metal-alumina-nitride-oxide-silicon (MANOS) structure. The polysilicon layer is preferably doped with n-type impurities. When a metallic layer is used as the control gate electrode 240 to form the MONOS or MANOS structure, the metallic layer preferably has a work function of about 4.5 eV or higher. Examples of suitable metallic layers include titanium nitride (TiN) layers, tantalum nitride (TaN) layers, hafnium nitride (HfN) layers, tungsten nitride (WN) layer and combinations thereof. To reduce the resistance of a control gate line, a low-resistance layer (not shown) may be arranged on the control gate electrode 240. The low-resistance layer varies depending upon the material used for the control gate electrode 240, which is determined by reactivity on the interface between the control gate electrode 240 and the low-resistance layer.

Figure 3:
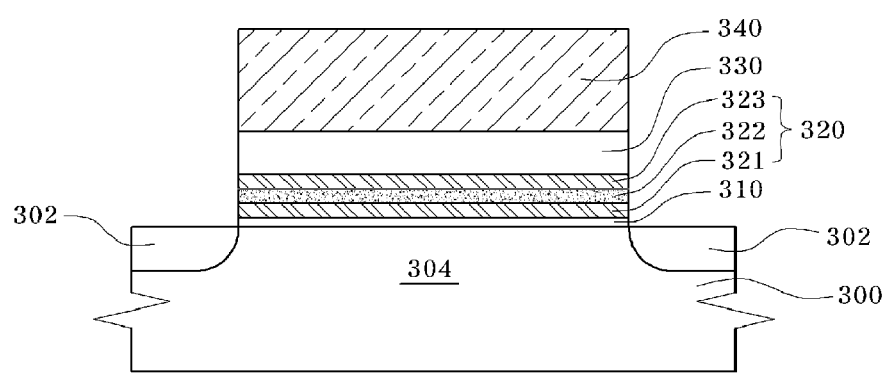
FIG. 3 is a cross-sectional view illustrating a non-volatile memory device having a charge trapping layer according to another embodiment of the invention.

FIG. 3 is a cross-sectional view illustrating a non-volatile memory device having a charge trapping layer according to another embodiment of the invention. Referring to FIG. 3, the non-volatile memory device includes a tunneling layer 310, a charge trapping layer 320, a blocking layer 330, and a control gate electrode 340 deposited on a substrate 300 in this order. The charge trapping layer 320 preferably comprises or consists of a first nitride layer 321, a silicon-boron-nitride (SiBN) layer 322 and a second nitride layer 321 sequentially deposited as shown. The substrate 300 includes a pair of impurity regions 302 spaced apart from each other by a channel region 304.

The charge trapping layer 330 is a triple-layer comprising or consisting of the first nitride layer 321, the silicon-boron-nitride (SiBN) layer 322 and the second nitride layer 323 sequentially deposited as shown. The first nitride layer 321 prevents the diffusion of boron (B) from the silicon-boron-nitride (SiBN) layer 322 to the tunneling layer 310. In addition, the second nitride layer 323 prevents the diffusion of boron (B) from the silicon-boron-nitride (SiBN) layer 322 to the blocking layer 330. The first and second nitride layers 321 and 322 offset the deterioration of retention characteristics caused by the conductivity of the high-trap density silicon-boron-nitride (SiBN) layer 322. The first nitride layer 321 is preferably a stoichiometric silicon nitride ($Si_3N_4$) layer or a silicon oxide nitride (SiON) layer. The silicon oxide nitride (SiON) layer exhibits superior trapping capability, and thus shows improved retention characteristics, when compared to the stoichiometric silicon nitride ($Si_3N_4$) layer.

The charge trapping layer 320 preferably has a thickness of about 60 Å to 180 Å. The first nitride layer 321 has a thickness of about 20 Å to 60 Å. Similarly, the silicon boron nitride layer 322 and the second nitride layer 321 preferably have a thickness of about 20 Å to 60 Å. Boron (B) contained in the silicon boron nitride layer 322 acts as an impurity therein. As a result, the silicon boron nitride layer 322 has a high trap density, as compared to general nitride layers. The higher the concentration of boron (B), the higher the trap density. However, in the case where the concentration of boron (B) contained in the silicon boron nitride layer 322 is excessively high, overall reliability of the silicon boron nitride layer 322 is degraded. Accordingly, the concentration of the boron (B) in the silicon boron nitride layer 322 is preferably adjusted to about 1 wt. % to 30 wt. %.

Figure 4:
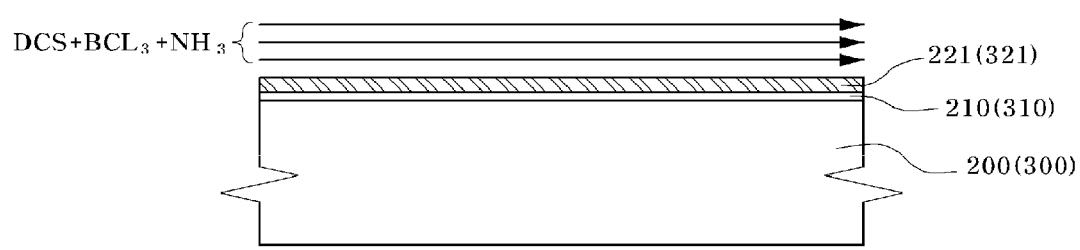
FIGS. 4 to 6 are cross-sectional views illustrating a method for fabricating a non-volatile memory device having a charge trapping layer according to the invention.
Figure 5:
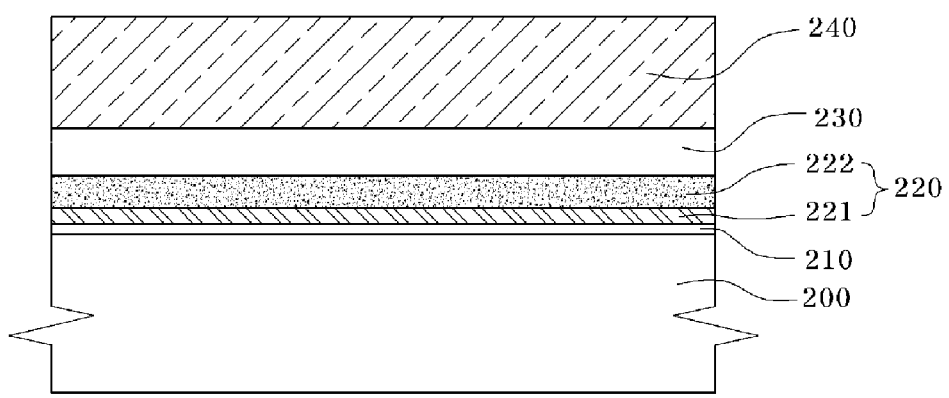
Figure 6:
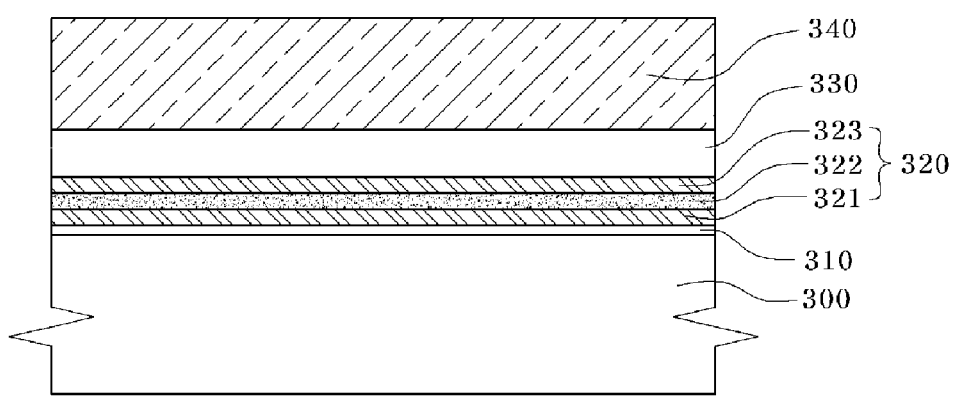

FIGS. 4 to 6 are cross-sectional views illustrating a method for fabricating a non-volatile memory device having a charge trapping layer according to the invention. Referring to FIG. 4, impurity regions and a channel region between the impurity regions are formed in the substrate 200/300. Then, the tunneling layer 210/310 is preferably formed on the substrate 200/300. The tunneling layer 210/310 is formed of a silicon oxide layer preferably having a thickness of 20 Å to 60 Å. The nitride layer 221/321 is formed on the tunneling layer 210/310. The formation of the nitride layer 221/321 is preferably carried out by depositing $Si_3N_4$ or SiON, preferably using atomic layer deposition (ALD) or chemical vapor deposition (CVD). The thickness of the nitride layer 221/321 is adjusted to about 20 Å to 60 Å. Dichlorosilane (DCS; $Si_2H_2Cl_2$), $BCl_3$, and $NH_3$ gases illustratively flow on the nitride layer 221/321. Alternatively, a silicon (Si)-containing gas or a solid source may be used instead of these gases. Suitable silicon (Si)-containing gases, include, for example, $SiH_4$, $Si_3H_8$, hexachlorodisilane (HCD; $Si_2Cl_6$), and bis(tertiarybutylamino)silane (BTBAS). The concentration of boron (B) in the silicon boron nitride layer can be adjusted to a desired level by controlling the supply amount of $BCl_3$ as a source gas of boron (B), for example.

Referring to FIG. 5, the silicon boron nitride 222 layer according to one embodiment of the invention is preferably formed to a thickness of 40 Å to 120 Å. The silicon boron nitride 222 layer and the underlying nitride layer 221 constitute the charge trapping layer 220. The total thickness of the charge trapping layer 220 is preferably about 60 Å to 180 Å. The blocking layer 230 is formed on the silicon boron nitride layer 222. The formation of the blocking layer 230 is preferably carried out by depositing an oxide via chemical vapor deposition (CVD). Alternatively, the blocking layer 230 may be formed of aluminum oxide ($Al_2O_3$) to improve device characteristics. At this time, the blocking layer 230 is preferably formed by depositing aluminum oxide ($Al_2O_3$) to a thickness of about 50 Å to 300 Å and subjecting the deposition to densification by rapid thermal processing (RTP). In addition, the blocking layer 230 may be composed of a high-dielectric insulating material, e.g., hafnium oxide ($HfO_2$), a hafnium aluminum oxide (HfAlO), a zirconium oxide ($ZrO_2$), or a combination thereof.

Then, the control gate electrode 240 is formed on the blocking layer 230. The control gate electrode 240 is preferably a polysilicon layer or a metallic layer. The polysilicon layer is preferably doped with n-type impurities. The concentration of the n-type impurities is preferably adjusted to $1 \times 10^{19}$ ions/$cm^3$ to $5 \times 10^{20}$ ions/$cm^3$ to minimize gate depletion. By formation of a tungsten silicide (WSi) layer or a tungsten nitride/tungsten silicide (WN/WSi) layer, for example on the polysilicon layer, the gate resistance can be reduced. When a metallic layer is used as the control gate electrode 240, the metallic layer is preferably composed of a metal having a work function of about 4.5 eV or higher. For example, the metallic layer is preferably selected from titanium nitride (TiN) layers, tantalum nitride (TaN) layers, hafnium nitride (HfN) layers, tungsten nitride (WN) layers, or combinations thereof. To reduce the resistance of a control gate line, a polysilicon/tungsten nitride/tungsten silicide (poly-SiWN/WSi) layer is preferably formed on the metallic layer.

After the tunneling layer 210, the charge trapping layer 220 including the nitride layer 221 and the silicon-boron-nitride (SiBN) layer 222, the blocking layer 230, and the control gate electrode 240 are sequentially formed on the substrate 200, the resulting structure is subjected to common patternization using a hard mask layer pattern to form a gate stack including the charge trapping layer 220.

Referring to FIG. 6, the silicon boron nitride layer 322 is preferably formed to a thickness of about 20 Å to 60 Å according to another embodiment of the invention. The nitride layer 323 is preferably formed to a thickness of about 20 Å to 60 Å on the silicon boron nitride layer 322. The silicon boron nitride layer 322, the first nitride layer 321 arranged under the silicon boron nitride layer 322, and the second nitride layer 323 arranged thereon constitute the charge trapping layer 320. The second nitride layer 323 can be formed in the same manner as the case of the first nitride layer. Similarly, the second nitride layer 323 is preferably formed of silicon nitride ($Si_3N_4$) or silicon oxide nitride (SiON). After formation of the charge trapping layer 320, the blocking layer 330 is preferably formed on the second nitride layer 323. The formation of the blocking layer 330 is carried out by depositing an oxide via chemical vapor deposition (CVD). Alternatively, the blocking layer 330 may be formed of aluminum oxide ($Al_2O_3$) to improve device characteristics. At this time, the blocking layer 330 is formed preferably by depositing aluminum oxide ($Al_2O_3$) to a thickness of about 50 Å to 300 Å and subjecting the deposition to densification, preferably by rapid thermal processing (RTP). In some cases, the blocking layer 330 may be composed of a high-dielectric insulating material, e.g., hafnium oxide ($HfO_2$), hafnium aluminum oxide (HfAlO), zirconium oxide ($ZrO_2$), or a combination thereof.

Then, the control gate electrode 340 is formed on the blocking layer 330. The control gate electrode 340 is preferably a polysilicon layer or a metallic layer. The polysilicon layer is preferably doped with n-type impurities. The concentration of the n-type impurities is preferably adjusted to $1 \times 10^{19}$ ions/$cm^3$ to $5 \times 10^{20}$ ions/$cm^3$ to minimize gate depletion. By formation of a tungsten silicide (WSi) layer, or a tungsten nitride/tungsten silicide (WN/WSi) layer for example, on the polysilicon layer the gate resistance can be reduced. In a case where a metallic layer is used as the control gate electrode 240, the metallic layer is preferably composed of a metal having a work function of about 4.5 eV or higher. Examples of suitable metallic layers include titanium nitride (TiN) layers, tantalum nitride (TaN) layers, hafnium nitride (HfN) layers, tungsten nitride (WN) layers and combinations thereof. To reduce the resistance of a control gate line, a polysilicon/tungsten nitride/tungsten silicide (poly-SiWN/WSi) layer is preferably formed on the metallic layer.

After the tunneling layer 310, the charge trapping layer 320 including the first nitride layer 321, the silicon-boron-nitride (SiBN) layer 322, and the second nitride 323, the blocking layer 330, and the control gate electrode 340 are sequentially formed on the substrate 300, and the resulting structure is subjected to common patternization using a hard mask layer pattern, to form a gate stack including the charge trapping layer 320.

As is apparent from the foregoing, according to the invention, a non-volatile memory device and a method for fabricating the device use a charge trapping layer having a double-layer including a nitride layer and a silicon-boron-nitride (SiBN) layer, or a triple-layer consisting of the first nitride layer, the silicon-boron-nitride (SiBN) layer, and a second nitride layer. As a result, the non-volatile memory device of the invention has advantages of increased trap density of the charge trapping layer, and thus increased erase speed without deterioration of retention characteristics.

What is claimed is:

1. A non-volatile memory device comprising:
a substrate;
a tunneling layer over the substrate;
a charge trapping layer on the tunneling layer, wherein the charge trapping layer comprises a second nitride layer and a silicon boron nitride layer stacked on a first nitride layer, the second nitride layer being in direct contact with the silicon boron nitride layer, the silicon boron nitride layer being in direct contact with the first nitride layer, and the first nitride layer being in direct with the tunneling layer, wherein the silicon boron nitride layer is SiBN;
a blocking layer over the charge trapping layer; and
a control gate electrode arranged on the blocking layer.

2. The non-volatile memory device according to claim 1, wherein the silicon boron nitride layer has a concentration of the boron (B) in the range of 1% to 30% by weight.

3. The non-volatile memory device according to claim 1, wherein the silicon boron nitride layer has a thickness of 20 Å to 60 Å.

4. The non-volatile memory device according to claim 1, wherein at least one of the first nitride layer and the second nitride layer is a silicon nitride layer or a silicon oxide nitride layer.

* * * * *